United States Patent
Weale et al.

(10) Patent No.: US 9,705,216 B2
(45) Date of Patent: Jul. 11, 2017

(54) DISTRIBUTING WIRING BOARD CONNECTIONS

(71) Applicant: GE Aviation Systems Limited, Cheltenham, Gloucestershire (GB)

(72) Inventors: Denis Vaughan Weale, Cheltenham (GB); Julian Peter Mayes, Cheltenham (GB)

(73) Assignee: GE AVIATION SYSTEMS LIMITED, Cheltenham, Gloucestershire (GB)

( * ) Notice: Subject to any disclaimer, the term of this patent is extended or adjusted under 35 U.S.C. 154(b) by 0 days.

(21) Appl. No.: 15/350,239

(22) Filed: Nov. 14, 2016

(65) Prior Publication Data

US 2017/0170583 A1    Jun. 15, 2017

(30) Foreign Application Priority Data

Dec. 14, 2015 (GB) .................................. 1521991.8

(51) Int. Cl.
*H01R 12/00* (2006.01)
*H01R 12/70* (2011.01)
(Continued)

(52) U.S. Cl.
CPC ....... *H01R 12/7088* (2013.01); *H01R 12/718* (2013.01); *H01R 13/2414* (2013.01);
(Continued)

(58) Field of Classification Search
CPC .............................. H01R 23/722; H01R 12/57
(Continued)

(56) References Cited

U.S. PATENT DOCUMENTS 4,806,107 A * 2/1989 Arnold ................. H01R 23/688
                                                              439/101
5,888,076 A * 3/1999 Itoh ..................... G02F 1/13452
                                                              439/74
(Continued)

FOREIGN PATENT DOCUMENTS

CN    1700453 A    4/2005
EP    2073265 A1   11/2008

OTHER PUBLICATIONS

International Search Report issued in connection with corresponding Great Britain application 1521991.8 dated Jun. 9, 2016.

*Primary Examiner* — Phuongchi T Nguyen (74) *Attorney, Agent, or Firm* — GE Global Patent Operation; William S. Munnerlyn (57) ABSTRACT

The present embodiments relate to providing electrical connectivity to electric-powered components mounted in parallel on a wiring board. An electrical apparatus is provided in which electricity is conducted from an electrically conductive member onto first and second electrically conductive pathways, of a wiring board through the use of first and second resiliently-deformable electrically conductive connectors. First and second electric-powered components are mounted to the respective first and second electrically conductive pathways. The first and second resiliently-deformable electrically conductive connectors are compressed between the electrically conductive member and the wiring board such that the first connector provides an electrical connection between the conductive member and the first electrically conductive pathway, and the second connector provides an electrical connection between the conductive member and the second electrically conductive pathway.

20 Claims, 4 Drawing Sheets (51) Int. Cl.
*H01R 12/71* (2011.01)
*H01R 13/24* (2006.01)
*H01R 13/658* (2011.01)
*H05K 1/02* (2006.01)
*H05K 1/18* (2006.01)

(52) U.S. Cl.
CPC ......... *H01R 13/658* (2013.01); *H05K 1/0216* (2013.01); *H05K 1/0263* (2013.01); *H05K 1/181* (2013.01); *H05K 2201/10757* (2013.01)

(58) Field of Classification Search
USPC .................................................. 439/66, 862
See application file for complete search history.

(56) References Cited

U.S. PATENT DOCUMENTS

| | | | | | |
|---|---|---|---|---|---|
| 6,083,047 | A | * | 7/2000 | Paagman | H01R 13/6587 439/607.07 |
| 6,312,263 | B1 | * | 11/2001 | Higuchi | H01R 13/2435 439/66 |
| 7,137,193 | B2 | * | 11/2006 | Williams | H01L 21/4857 257/E21.508 |
| 8,547,699 | B1 | * | 10/2013 | McCleary | H05K 7/20445 165/104.33 |

\* cited by examiner

DISTRIBUTING WIRING BOARD CONNECTIONS

TECHNICAL FIELD

The present embodiments relate to providing electrical connectivity to electric-powered components mounted in parallel on wiring boards.

BACKGROUND ART

The use of wiring boards containing strips of conductive metal tracking (typically made of copper) is common in electric circuit design, with electric-powered components mounted to the tracks provided on the board. Such tracks may be provided by the use of etching of copper onto a substrate material of the board.

It is also known to control high current through the use of multiple low-current-drawing electric-powered components connected in parallel with respect to each other and mounted to the tracks of such a wiring board, so as to achieve a higher power rating. Semiconductor devices are one example of such a low-current-drawing electric-powered component. However, there are problems with providing electric current to/from an arrangement of electric-powered components connected in parallel and mounted on such a wiring board. These problems may be understood from the discussion in the following paragraphs.

In a first example it is known to establish a common electrical connection with a wiring board to provide for current flow on/off the wiring board. It is known for the common electrical connection to be a location on a track of the wiring board from which multiple parallel paths subsequently branch off. Each branch provides for current flow to/from the electric-powered component(s) provided on the given branch. A problem arises due to the fact that the common electric connection on the wiring board is exposed to higher current flow than each of the individual parallel branches. This is due to the common electrical connection seeing the total amount of current which is subsequently shared between the various parallel branches. This relatively high current flow at the common electric connection on the wiring board requires the use of tracking of correspondingly larger cross-sectional area so as to manage the voltage drop on/off the wiring board and to avoid the tracking material melting. Maintaining a balanced impedance across an array of such electric-powered components mounted on a wiring board and connected in parallel with respect to each other to ensure that they each carry an equal load requires either: each individual conduction path of the different parallel paths being designed to enable this; or a grid of heavy grade conductive tracking being provided to connect the individual electric-powered components on the different parallel paths to the common electrical connection location located on the wiring board.

Both techniques (i) and (ii) above would require customisation of a conventional wiring board, with the disadvantages of increased complexity and weight (due to heavier conductive tracking being employed) in the design of the wiring board. Additionally, the heavier grade tracking necessary to carry the current flows on/off the wiring board is not readily suited to conveying lower level discrete analogue and digital signals to/from (often sensitive) electric-powered components mounted on the parallel branches of the wiring board tracking. To preserve signal integrity, where a grid of heavier grade tracking is employed to carry current flows on/off the wiring board, the board may have to also incorporate lighter grade tracking material to carry the lower level discrete analogue and digital signals. The use of different thicknesses of tracking on a wiring board has the disadvantage of increasing complexity of the wiring board's design and fabrication. Note that the terms "heavy" and "light" are used in a relative sense to refer to tracking of relatively larger and smaller cross-sections.

In a second example it is known for pinned connectors of a given fixed length to be used between a busbar and individual tracks on a wiring board, with the busbar spaced apart from the wiring board and acting as the common electric connection for current flow through different pinned connectors into respective tracks on the wiring board. Different ones of the pinned connectors establish separate parallel branches, of which the corresponding tracks to which each pinned connector joins form part. Significantly, the busbar and the wiring board are limited to being spaced a precise, fixed distance apart from each other to enable the pinned connectors to establish an electrical connection between the busbar and the wiring board. Although the use of such a configuration of pinned connectors ensures that no single part of the tracking on the wiring board is exposed to the total current flow entering or leaving the wiring board, the use of pinned connectors has a disadvantage of requiring each pinned connector to be separately fixed to the wiring board and/or the busbar (often by soldering)—a time-consuming task.

There is therefore a need to provide for an improved means of conveying current on/off a wiring board.

Accordingly, there is provided an electrical apparatus which includes a wiring board; at least one electrically conductive member spaced apart from and extending over at least part of the wiring board; at least first and second electric-powered components; and at least first and second resiliently-deformable electrically conductive connectors. The wiring board comprising at least first and second electrically conductive pathways, the first and second electric-powered components mounted to the first and second electrically conductive pathways respectively. The electrically conductive member and the wiring board arranged relative to each other such that the first and second resiliently-deformable connectors are compressed between the conductive member and the wiring board such that the first connector provides an electrical connection between the conductive member and the first electrically conductive pathway; and the second connector provides an electrical connection between the conductive member and the second electrically conductive pathway. The first and second resiliently-deformable connectors establish respective first and second parallel branches of an electric circuit from the conductive member, wherein the first branch comprises the first electrically conductive pathway and the first electric-powered component and the second branch comprises the second electrically conductive pathway and the second electric-powered component.

The wiring board may take any conventional form. Indeed, according to the present embodiments, the electrical apparatus allows high total current flows to be fed onto and/or off the wiring board without the need for significant customisation of the wiring board. The first and second electrically conductive pathways are conveniently provided to comprise tracks of electrically conductive material. Copper or another electrically conductive material may be used to form the tracks. The wiring board conveniently includes a fibrous substrate on or in which the tracks are mounted.

The electrically conductive member provides for electricity flow onto and/or off the wiring board. The conductive member is provided in any convenient form; for example, it may take the form of a bar, a rod or a plate made of copper, aluminium or another electrically conductive material known to the skilled person. Conveniently, the conductive member is provided as a busbar. The conductive member is conveniently provided such that it has a greater current carrying capacity than either of the first and second electrically conductive pathways of the wiring board; this thereby gives the conductive member the capacity to carry a total current flow in excess of that of the current carrying capacity of either of the first or second electrically conductive pathways and makes the conductive member suitable for providing the common electrical connection for current flow onto and/or off the wiring board.

The first and second resiliently-deformable electrically conductive connectors establish the respective first and second parallel branches of the electric circuit from the conductive member. Each resiliently-deformable electrically conductive connector carries a portion of the total current flow seen by the conductive member. The total current flow onto and/or off the wiring board is only seen by the conductive member. This configuration therefore avoids the need to upgrade the weight of tracking on a wiring board to enable any of the individual tracks to carry the total current flow on and/or off the wiring board.

The resilient-deformability of the connectors means that, when compared to use of known pinned connectors of a fixed length, it is possible to use a range of spatial separation distances between the electrically conductive member and the wiring board whilst still establishing electrical connection therebetween. The compressibility of the resiliently-deformable connectors also acts to promote retention of a reliable electrical connection of the connectors between the conductive member and the wiring board. In an embodiment, because the electrical connectors are resiliently-deformable, they permit the conduction of electricity between the conductive member and both of the first and second electrically conductive pathways without necessarily requiring the electrical connectors to be permanently fixed (for example, through the use of solder) to both the conductive member and the pathways. Rather, the electrical connectors can be retained in position solely as a consequence of compression of the electrical connectors between the wiring board and the respective first and second pathways of the wiring board. However, for assisting in ease of assembly, the connectors may be secured to the first and second electrically conductive pathways of the wiring board as this helps to ensure that a given connector establishes and maintains electrical connection with a given pathway. Solder or other known means may be used to secure the connectors to the conductive pathways.

Trials have been performed using metallic connectors in the form of spring contacts having a Z-shaped cross-sectional profile, with the connectors compressed between the electrically conductive member (provided in the form of a busbar) and corresponding tracks on the wiring board by virtue of opposing top and bottom end portions of the Z-shaped profile. Trials have also been performed using metallic connectors in the form of a spring contacts having a C-shaped cross-sectional profile. Steel, aluminium, brass or copper are other non-limiting examples of potentially suitable materials for the connectors, but other materials known to the skilled person may also be suitable subject to their having the necessary properties of being resiliently-deformable and electrically conductive.

The electric-powered components may take any form. However, the embodiments may be particularly beneficial when the electrical apparatus uses semiconductor devices as the components, with semiconductor devices generally understood to be low-power devices having low current requirements. The electrical connection in parallel of two or more such semiconductor devices in an electric circuit is able to provide benefits of a high power rating from the circuit.

In an embodiment, the at least one electrically conductive member comprises a first electrically conductive member and a second electrically conductive member, and the apparatus further includes a first set of the first and second resiliently-deformable electrically conductive connectors compressed between the first conductive member and the wiring board to thereby electrically connect in parallel the first conductive member to the first and second electric-powered components such that the first conductive member provides an input current along the first and second branches to the first and second electric-powered components respectively; and a second set of the first and second resiliently-deformable electrically conductive connectors compressed between the second conductive member and the wiring board to thereby electrically connect in parallel the second conductive member to the first and second electric-powered components such that the second conductive member receives an output current along the first and second branches from the first and second electric-powered components respectively.

The above-described arrangement allows the first set of the resiliently-deformable connectors to feed current from the first electrically conductive member onto the parallel-disposed first and second electrically conductive pathways of the wiring board to power the electric-powered components. The arrangement also allows the second set of the resiliently-deformable connectors to feed current off the wiring board from the electric-powered components through the parallel-disposed first and second electrically conductive pathways of the wiring board and onto the second electrically conductive member.

In an embodiment, the first and second electrically conductive members are arranged to face opposing outward-facing surfaces of the wiring board such that the wiring board is compressibly suspended between the first and second electrically conductive members by compression of the first and second sets of resiliently-deformable connectors, wherein the wiring board is configured such that the first electrically conductive pathway and the second electrically conductive pathway extend through the thickness of the wiring board. In this manner, the first and second sets of resiliently-deformable connectors help to isolate the wiring board and the components mounted thereon from mechanical shocks applied to either of the first or second conductive members. The degree of mitigation from mechanical shocks can be understood to be affected by the stiffness of the resiliently-deformable connectors.

Conveniently, the wiring board comprises vias extending between the opposing outward-facing surfaces of the wiring board so as to extend the first and second electrically conductive pathways through the thickness of the wiring board. This aspect may also be combined with electrically conductive tracks being provided on both of the opposed outward-facing surfaces of the wiring board, with each of the first and second electrically conductive pathways incorporating one or more tracks and vias. By way of non-limiting example, the first and second electric-powered components may be mounted to respective first and second groups of tracks provided on one of the opposed outward-facing surfaces of the wiring board, with vias establishing an electrically conductive pathway from these groups of tracks through the thickness of the wiring board to similar groups of tracks provided on the other outward-facing surface of the wiring board. The first and second sets of resiliently-deformable connectors may establish a direct physical connection to the first and second groups of tracks provided on the outward-facing surfaces of the wiring board, thereby enabling current flow from the first conductive member through the first set of resiliently-deformable connectors to the first and second groups of tracks (and the respective first and second electric-powered components mounted thereto), through corresponding vias to the corresponding groups of tracks on the other side of the wiring board, and then off the wiring board through the second set of resiliently-deformable electrical connectors to flow out into the second conductive member.

In an embodiment, a thermally conductive material is arranged between the at least one electrically conductive member and the wiring board. This aspect allows for improved conduction of heat away from the wiring board and out into the mass of the at least one conductive member. In an additional aspect, the thermally conductive material is arranged so as to conduct heat from one or both of the first and second electric-powered components to the conductive member. By way of non-limiting example, one or more pieces of thermally conductive foam may be arranged to directly contact the conductive member and one or both of the first and second electric-powered components. To enhance the ability to conduct heat generated by the electric-powered components away from the wiring board, either or both of the resiliently-deformable connectors and the conductive member may be formed of materials selected for their thermal conductivity. Use of a metallic material for the connectors may be beneficial because metals generally possess dual attributes of good thermal and electrical conductivity.

Conveniently, the at least one electrically conductive member is configured to provide electromagnetic shielding. For example and without limitation, the conductive member may be formed from aluminium or an alloy thereof, or other metallic materials.

In a further aspect, the apparatus further comprises a casing enclosing the wiring board, the at least one electrically conductive member forming at least a portion of the casing. To reduce or eliminate the risk of a person receiving electric shocks from current conveyed through the conductive member, in an embodiment, an outward-facing surface of the conductive member is provided with an electrically insulative coating thereon. Provision of an electrically insulative coating on an outward-facing surface of the conductive member would enable the conductive member to i) provide for current flow on and/or off the wiring board, and ii) at the same time, serve as all or part of an enclosure for the wiring board, where the exterior surface of enclosure is safe for a person to touch without fear of receiving an electric shock. For example, the electrically insulative coating may conveniently take the form of a plasticised or rubberised material.

Where the at least one electrically conductive member comprises first and second electrically conductive members arranged to face opposing outward-facing surfaces of the wiring board such that the wiring board is compressibly suspended between the first and second electrically conductive members (as described in the preceding paragraphs), the first and second conductive members may form at least a portion of the casing. This aspect provides enhanced physical protection for the wiring board due to being enclosed in whole or part by both of the first and second conductive members. To provide a person with protection from electric shocks, respective outward-facing surfaces of the first conductive member and the second conductive member may be provided with an electrically insulative coating thereon, as described above. Conveniently, a thermally conductive material is arranged between the wiring board and one or both of the first and second electrically conductive members, in a similar manner to that described above. This aspect provides for enhanced conduction of heat from heat generating components of the wiring board (such as the first and second electric-powered components). In an embodiment, the thermally conductive material is arranged so as to conduct heat from one or both of the first and second electric-powered components to one or both of the first and second conductive members.

BRIEF DESCRIPTION OF DRAWINGS

Examples of aspects and embodiments are described with reference to the following accompanying drawings.

Please note that the above figures are intended to illustrate non-limiting examples and are not drawn to scale.

DETAILED DESCRIPTION

Examples are described below with reference to the drawings listed above. The described examples are not seeking to limit the scope of the disclosure, but instead merely describe various non-limiting forms which the embodiments may take. The scope of the disclosure is as defined by and as falling within the scope of the claims.

Figure 1:
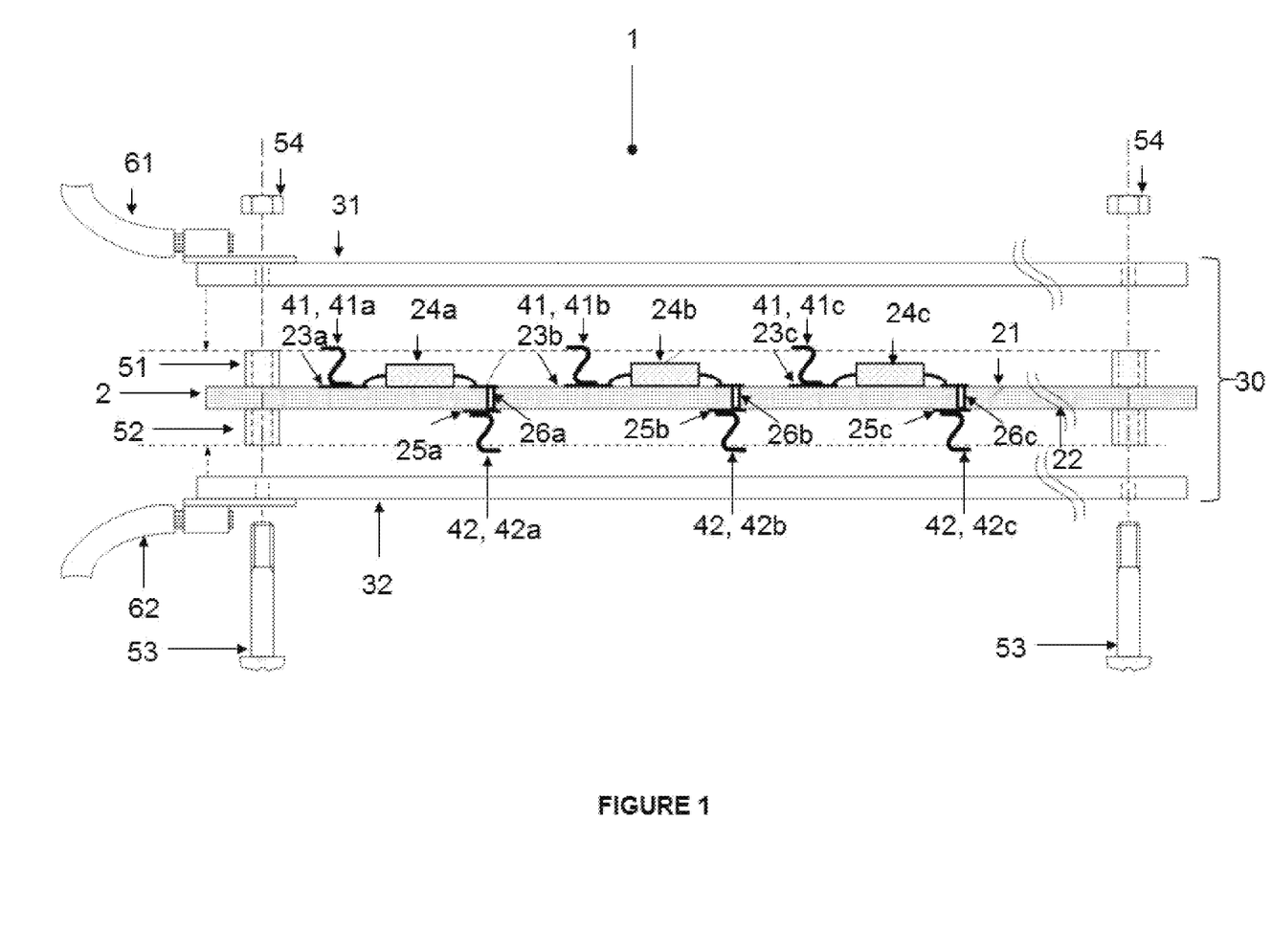
FIG. 1 illustrates an example side elevation view of individual parts of an example of an electrical apparatus before assembly in accordance with various aspects described herein.

FIG. 1 shows a side elevation view of an electrical apparatus 1. The electrical apparatus 1 has a wiring board 2, and first and second electrically conductive members 31, 32. The first and second electrically conductive members 31, 32 extend over and are spatially separate from opposing surfaces 21, 22 of the wiring board 2. The conductive members 31, 32 form part of a casing 30 partially enclosing the wiring board 2. For the example shown in FIG. 1, the first and second electrically conductive members 31, 32 take the form of busbar plates made of aluminium. Aluminium is electrically and thermally conductive, whilst being lighter in mass compared to alternative materials such as steel. The use of metallic materials for the conductive members 31, 32 provides an ability to provide electromagnetic shielding to the wiring board 2 and electric-powered components 24a, 24b, 24c mounted thereon. As indicated in the general description above, in other embodiments the electrically conductive members 31, 32 may take the form of a rod or other suitable form which extends over at least part of the wiring board 2. Further, copper or other metallic materials are suitable alternatives to aluminium for the conductive members 31, 32; non-metallic materials may also be used, subject to them being capable of conducting electricity.

Figure 2:
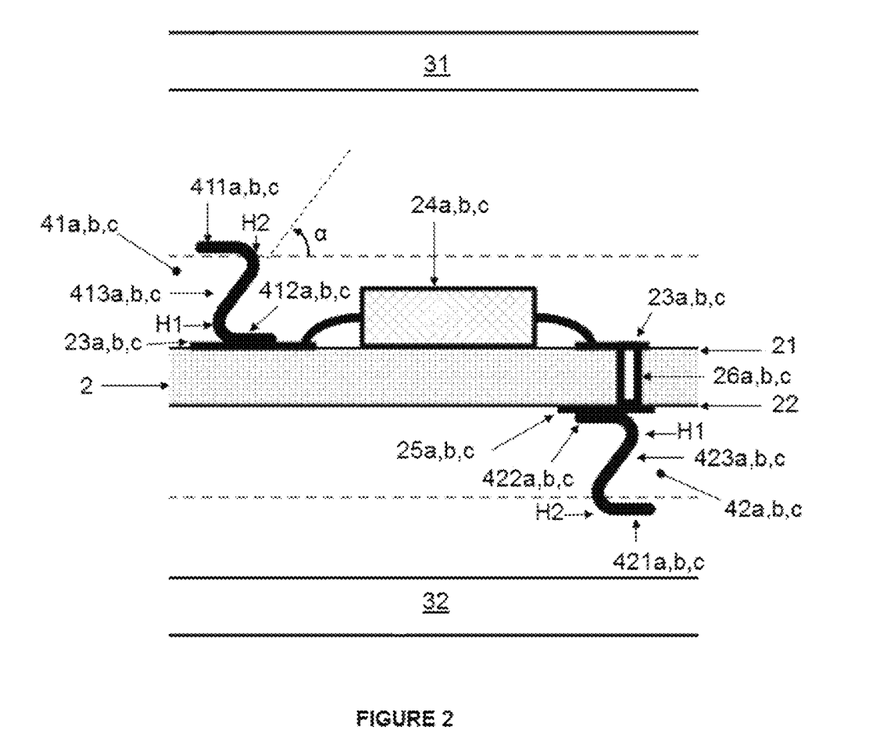
FIG. 2 illustrates an example detail side elevation view of part of the electrical apparatus in accordance with various aspects described herein.

As shown in FIGS. 1 and 2, the wiring board 2 is provided with first, second and third groups 23a, 23b, 23c of tracking on surface 21. First, second and third electric-powered components 24a, 24b, 24c are mounted to the respective first, second and third groups 23a, 23b, 23c of tracking. In the example shown in FIG. 1, each tracking group is comprised of multiple tracks, with each component extending from one track to another track. The number of individual tracks in each tracking group is dependent upon the number of electric-powered components desired to be mounted to each tracking group. Although FIG. 1 shows only a single component 24a, 24b, 24c mounted to each group 23a, 23b, 23c of tracking, in other embodiments multiple components may be mounted to one or more of the tracking groups. For the example illustrated in the figures, the tracking is made of copper. However, in other embodiments the tracking may be made from other materials, whether metallic or non-metallic, subject to such materials being capable of conducting electricity. For the example being described, the components are semiconductors, but this is not a limitation of the embodiments. In other embodiments the components may be other than semiconductors.

A first set 41 of resiliently-deformable electrically conductive connectors 41a, 41b, 41c are compressed between the first electrically conductive member 31 and the surface 21 of the wiring board 2. As shown in the detail view of FIG. 2, a first end portion 411a, 411b, 411c of each connector 41a, 41b, 41c is arranged to contact the first electrically conductive member 31 and a second end portion 412a, 412b, 412c of each connector contacts respective tracks of the tracking groups 23a, 23b, 23c (also see FIG. 3, which shows the electric apparatus 1 in its assembled state). In this manner, an electrically conductive path is provided from the first electrically conductive member 31 to each of the tracking groups 23a, 23b, 23c. The first set 41 of resiliently-deformable connectors 41a, 41b, 41c has the effect of establishing three parallel branches from the first electrically conductive member 31, with each of the three connectors forming part of a different branch. The second end portion 412a, 412b, 412c of each connector 41a, 41b, 41c is fixed to a respective track of the tracking groups 23a, 23b, 23c by means of solder (not shown in the figures). However, in other embodiments alternative forms of fixing the connectors to the tracks may be used.

First, second and third groups 25a, 25b, 25c of tracking are provided on the opposing surface 22 of the wiring board 2. Tracks of each of the first, second and third tracking groups 25a, 25b, 25c connect with corresponding tracks of the first, second and third tracking groups 23a, 23b, 23c through the use of corresponding vias 26a, 26b, 26c (see FIG. 1). As best shown in FIG. 2, the vias 26a, 26b, 26c extend through the thickness of the wiring board 2. The first tracking groups 23a, 25a and interlinking via 26a form a first electrically conductive pathway; the second tracking groups 23b, 25b and interlinking via 26b form a second electrically conductive pathway; with the third tracking groups 23c, 25c and interlinking via 26c forming a third electrically conductive pathway. The first, second and third electrically conductive pathways form each of the three parallel branches referred to above, with the semiconductors 24a, 24b, 24c mounted to different branches and pathways. Although FIG. 1 shows only a single semiconductor mounted on each electrically conductive pathway, in other embodiments there may be multiple components mounted to one or more of the pathways. Further, in other embodiments, electric-powered components may be mounted to both surfaces 21, 22 of the wiring board.

The tracks in the example described are formed of copper. However, other metallic materials may be chosen, subject to having suitable electrically conductive properties. In common with the first and second electrically conductive members 31, 32, non-metallic materials may also be used so long as they are capable of conducting electricity.

A second set 42 of resiliently-deformable electrically conductive connectors 42a, 42b, 42c are compressed between the second electrically conductive member 32 and the surface 22 of the wiring board 2. In a similar manner to the first set 41 of connectors, a first end portion 421a, 421b, 421c of each connector 42a, 42b, 42c is arranged to contact the second electrically conductive member 32 and a second end portion 422a, 422b, 422c of each connector contacts respective ones of the tracking groups 25a, 25b, 25c. In this manner, an electrically conductive path is provided from each of the tracking groups 25a, 25b, 25c to the second electrically conductive member 32. The resiliently-deformable connectors 42a, 42b, 42c extend the three parallel branches so as to terminate the branches at the second electrically conductive member 32. In a similar manner to the first set 41 of connectors 41a, 41b, 41c, the second end portion 422a, 422b, 422c of each connector 42a, 42b, 42c is fixed to a respective track of the tracking groups 25a, 25b, 25c by means of solder. However, in other embodiments, alternative forms of fixing the connector to the track may be used. Trials have been performed using resiliently-deformable connectors made of a metallic material, as metal provides characteristics of being both electrically and thermally conductive, as well as being resilient-deformable. The characteristic of the connectors being made of material selected for its thermal conductivity (such as metallic materials) also enables the connectors to themselves efficiently conduct heat away from the wiring board.

Figure 3:
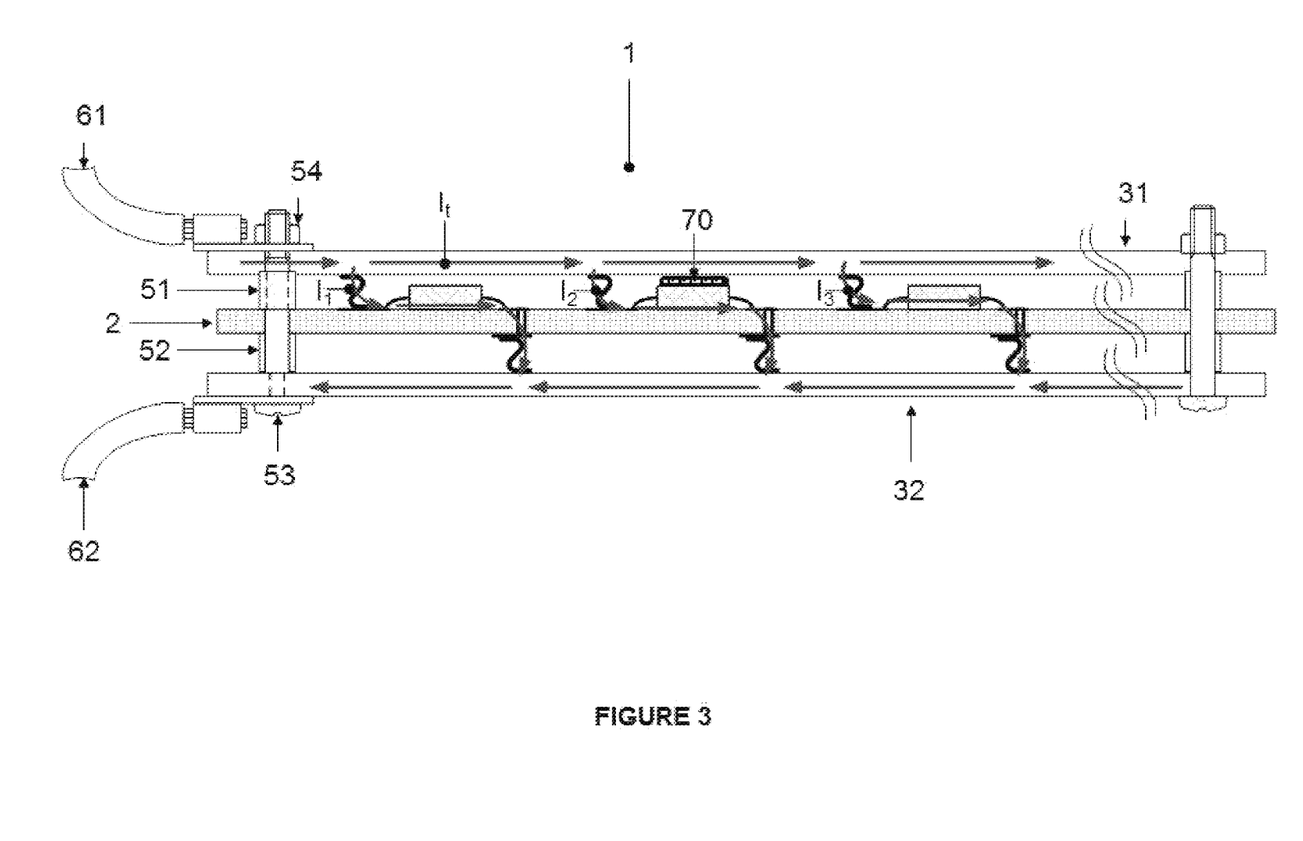
FIG. 3 illustrates an example side elevation view of the electrical apparatus of FIG. 1 after assembly, and the current flow through different parallel branches of the electric circuit established by the electrical apparatus in accordance with various aspects described herein.

The first end portions of both the first and second sets 41, 42 of resiliently-deformable connectors are not permanently secured to the respective first and second conductive members 31, 32. Rather, once the second end portions of the first and second sets 41, 42 of connectors have been secured to the relevant tracks on the wiring board 2, the first and second conductive members 31, 32 are located so as to face respective surfaces 21, 22 of the wiring board 2. The conductive members 31, 32 are spaced from the respective surfaces 21, 22 of the wiring board 2 so as to compress the respective first and second sets 41, 42 of resiliently-deformable connectors therebetween. As shown in FIGS. 1 & 3, the conductive members 31, 32 are arranged to locate against electrically-insulative spacers 51, 52 which also connect with the wiring board 2. These spacers 51, 52 serve to maintain each conductive member 31, 32 a fixed distance apart from the respective surface 21, 22 of the wiring board, and also help to avoid a short circuit being established between the two conductive members 31, 32. Bolts 53 extend through the spacers 51, 52 and the wiring board 2, with corresponding nuts 54 connecting to the bolt shanks to lock the conductive members 31, 32, wiring board 2 and spacers 51, 52 together.

The first and second sets 41, 42 of resiliently-deformable connectors have the effect of suspending the wiring board 2 between the first and second conductive members 31, 32. In the event of a mechanical shock being applied to either conductive member 31, 32, the connectors 41, 42 help to isolate and protect the wiring board 2 and the semiconductors 24a, 24b, 24c mounted thereon from the shock.

For the example shown in FIGS. 1 to 3, the connectors 41, 42 each have a Z-shaped cross-sectional profile. This Z-shaped cross-section is most clearly shown in the detail view of FIG. 2. For the first set 41 of connectors the first end portion 411a,b,c forms the top leg of the Z-profile, the second end portion 412a,b,c forms the bottom leg of the Z-profile. Connecting the first and second end portions (i.e. top and bottom legs) is an intermediate portion 413a,b,c (see FIG. 2). As the first conductive member 31 is brought to bear upon the free, unsecured first end portion 411a,b,c of a given connector 41, the first end portion 411a,b,c slides along the lower surface of the first conductive member 31 as the connector flexes about hinge points H1, H2 of the connector (see FIG. 2). The hinge points H1, H2 are the junctions between the first/second end portions and the intermediate end portion for a given connector. The flexing of the connectors about the hinge points H1, H2 as the connector is compressed between the first/second conductive member 31, 32 and the wiring board 2 also results in a reduction in the angle α between the intermediate portions 413a,b,c, and both the first and second end portions. The compression of the connectors 41, 42 is reacted at the surfaces of the wiring board 2 and the conductive members 31, 32.

Current is fed onto the first electrically conductive member 31 from a power source (not shown) by input cable 61 (see FIGS. 1 and 3). Current is fed off the second electrically conductive member 32 by output cable 62. In another embodiment, the input and output cables may be the opposite way round, with current fed onto the wiring board 2 and its components via conductive member 32 and fed off the wiring board 2 via conductive member 31. Due to the first and second sets 41, 42 of resiliently deformable connectors having the effect of establishing/terminating three parallel branches at the first conductive member 31 and the second conductive member 32, the total current flow onto and/or off the wiring board 2 is only seen by the conductive members 31, 32. This can be readily understood by viewing FIG. 3, which shows the electrical apparatus 1 of FIG. 1 when fully assembled. FIG. 3 shows the current flow through the different components of the electrical apparatus. The total current flow through the first conductive member 31 is $I_t$. The current flow through the three parallel branches between the first and second conductive members 31, 32 is $I_1$, $I_2$, and $I_3$, with the total current flow $I_t$ being shared between the three parallel branches. This can be expressed as follows:

$$I_t = I_1 + I_2 + I_3 \qquad \text{a.}$$

Also shown in FIG. 3 is the presence of a piece of thermally conductive foam 70 compressed between the uppermost surface of the second semiconductor 24b and the interior-facing surface of the conductive member 31. The thermally conductive foam 70 acts to conduct heat generated by the operation of semiconductor 24b into the mass of the conductive member 31. For the example shown in FIG. 3, a single piece of thermally conductive foam 70 is used for the second semiconductor 24b to represent the situation where the second semiconductor draws more current than the other two semiconductors 24a, 24c. However, in other embodiments, thermally conductive foam may be used to conduct heat away from two, more or all of the semiconductors, whether as a single piece of foam which extends between adjacent semiconductors or as discrete foam pieces for each semiconductor. The same aspects apply where the electric-powered components 24a,b,c are other than semiconductors. The use of thermally conductive foam supplements the heat conducting capability provided by the resiliently-deformable connectors being made of metallic material, with the foam acting as an additional thermal pathway between the wiring board 2 and the conductive member 31. The use of a metallic material for the conductive member 31 enables the conductive member 31 to function as a radiator to cool the electric-powered components provided on the wiring board.

Although not illustrated in the figures the exterior-facing surfaces of the first and second conductive members 31, 32 may be coated with an electrically-insulative material, thereby enabling a user to touch the exterior-facing surface of the conductive members without fear of receiving an unwelcome electric shock. As can be seen from FIGS. 1 and 3, the first and second conductive members 31, 32 effectively form a casing 30 enclosing the wiring board 2 and the semiconductor devices 24a,b,c mounted thereon.

Figure 4:
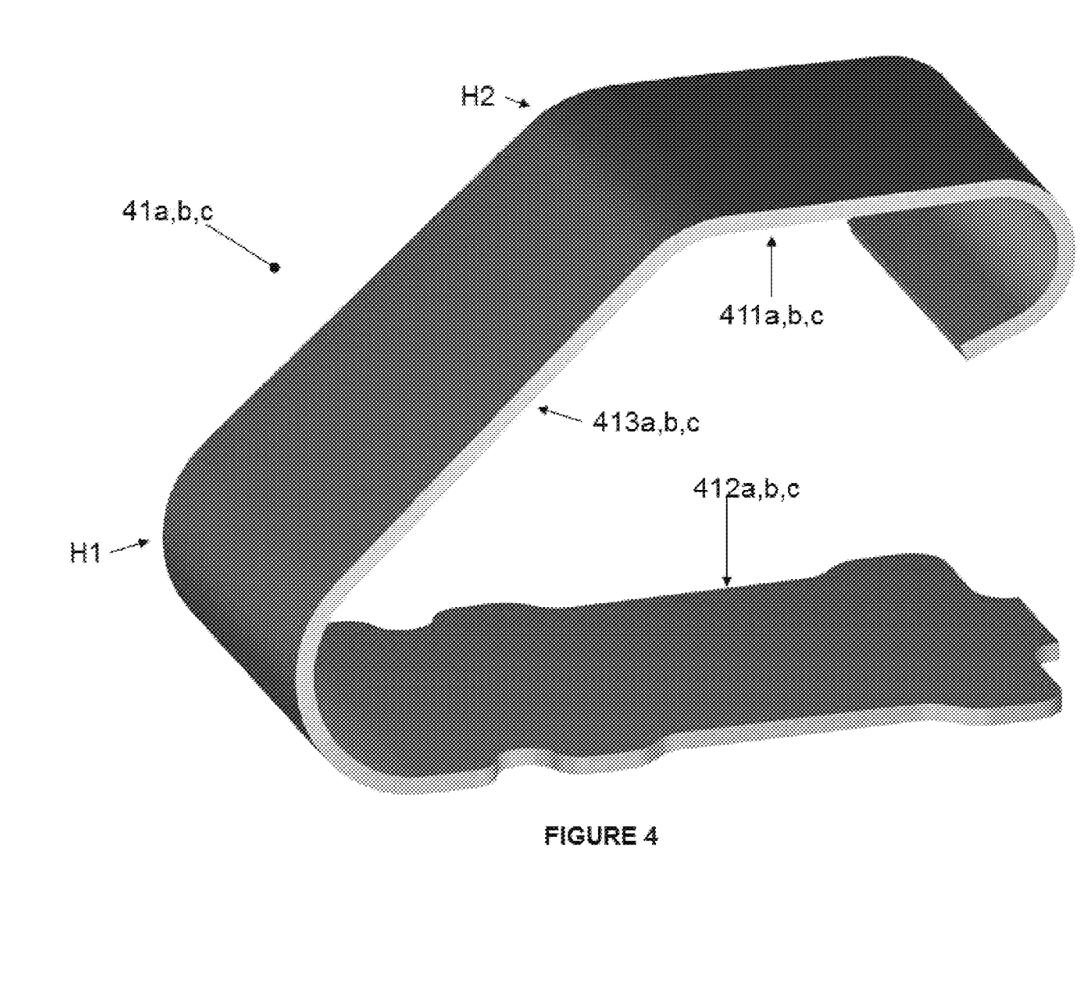
FIG. 4 illustrates an example additional or alternative form of resiliently-deformable connector to that illustrated in accordance with various aspects described herein.

FIG. 4 shows an alternative form of resiliently-deformable connector 41a,b,c, but having a C-shaped cross-section. The various portions of this alternative connector are labelled with the same reference numerals as used for the Z-shaped connector illustrated in FIGS. 1 and 2. However, in other embodiments the resiliently deformable connector may take other forms, subject to the connector having the ability to be resiliently deformable and being electrically conductive.

It is to be understood that even though numerous characteristics and advantages of various embodiments have been set forth in the foregoing description, together with details of the structure and functions of various embodiments, this disclosure is illustrative only, and changes may be made in detail, especially in matters of structure and arrangement of parts within the principles of the embodiments to the full extent indicated by the broad general meaning of the terms in which the appended claims are expressed. It will be appreciated by those skilled in the art that the teachings disclosed herein can be applied to other systems without departing from the scope and spirit of the application.

What is claimed is:

1. An electrical apparatus comprising:
   a wiring board;
   at least one electrically conductive member spaced apart from and extending over at least part of the wiring board;
   at least first and second electric-powered components; and
   at least first and second resiliently-deformable electrically conductive connectors;
   the wiring board comprising at least first and second electrically conductive pathways, the first and second electric-powered components mounted to the first and second electrically conductive pathways respectively;
   the electrically conductive member and the wiring board arranged relative to each other such that the first and second resiliently-deformable connectors are compressed between the conductive member and the wiring board such that:
   the first connector provides an electrical connection between the conductive member and the first electrically conductive pathway; and
   the second connector provides an electrical connection between the conductive member and the second electrically conductive pathway;
   whereby the first and second resiliently-deformable connectors establish respective first and second parallel branches of an electric circuit from the conductive member, wherein the first branch comprises the first electrically conductive pathway and the first electric-powered component and the second branch comprises the second electrically conductive pathway and the second electric-powered component.

2. The electrical apparatus of claim 1, wherein the at least one electrically conductive member is a plate, a rod or a busbar.

3. The electrical apparatus of claim 1, whereby the at least one electrically conductive member is configured to provide electromagnetic shielding.

4. The electrical apparatus of claim 3, wherein the conductive member is formed from aluminium or an alloy thereof.

5. The electrical apparatus of claim 1, wherein the apparatus further comprises a casing enclosing the wiring board, the at least one electrically conductive member forming at least a portion of the casing.

6. The electrical apparatus of claim 5, wherein an outward-facing surface of the conductive member is provided with an electrically insulative coating thereon.

7. The electrical apparatus of claim 1, wherein a thermally conductive material is arranged between the at least one electrically conductive member and the wiring board.

8. The electrical apparatus of claim 7, wherein the thermally conductive material is arranged so as to conduct heat from one or both of the first and second electric-powered components to the conductive member.

9. The electrical apparatus of claim 7, wherein the first and second resiliently-deformable connectors are configured to function as all or part of the thermally conductive material.

10. The electrical apparatus of claim 7, wherein the thermally conductive material comprises a foam.

11. The electrical apparatus of claim 10, wherein the foam is compressed between the electrically conductive member and at least one of the first and second electric-powered components.

12. The electrical apparatus of claim 1, wherein the at least one electrically conductive member comprises a first electrically conductive member and a second electrically conductive member, the apparatus further comprising:
   a first set of the first and second resiliently-deformable electrically conductive connectors compressed between the first conductive member and the wiring board to thereby electrically connect in parallel the first conductive member to the first and second electric-powered components such that the first conductive member provides an input current along the first and second branches to the first and second electric-powered components respectively; and
   a second set of the first and second resiliently-deformable electrically conductive connectors compressed between the second conductive member and the wiring board to thereby electrically connect in parallel the second conductive member to the first and second electric-powered components such that the second conductive member receives an output current along the first and second branches from the first and second electric-powered components respectively.

13. The electrical apparatus of claim 12, wherein the first and second electrically conductive members are arranged to face opposing outward-facing surfaces of the wiring board such that the wiring board is compressibly suspended between the first and second electrically conductive members by compression of the first and second sets of resiliently-deformable connectors, wherein the wiring board is configured such that the first electrically conductive pathway and the second electrically conductive pathway extend through the thickness of the wiring board.

14. The electrical apparatus of claim 13, wherein the wiring board comprises vias extending between the opposing outward-facing surfaces of the wiring board so as to extend the first and second electrically conductive pathways through the thickness of the wiring board.

15. The electrical apparatus of claim 13, wherein the apparatus further comprises a casing enclosing the wiring board, the first and second electrically conductive members forming at least a portion of the casing.

16. The electrical apparatus of claim 15, wherein respective outward-facing surfaces of the first electrically conductive member and the second electrically conductive member are provided with an electrically insulative coating thereon.

17. The electrical apparatus of claim 13, wherein a thermally conductive material is arranged between the wiring board and one or both of the first and second electrically conductive members.

18. The electrical apparatus of claim 17, wherein the thermally conductive material is arranged so as to conduct heat from one or both of the first and second electric-powered components to one or both of the first and second electrically conductive members.

19. The electrical apparatus of claim 17, wherein the first and second resiliently-deformable connectors are configured to function as all or part of the thermally conductive material.

20. The electrical apparatus of claim 17, wherein the thermally conductive material comprises a foam.

* * * * *